(12) United States Patent
Lai

(10) Patent No.: US 9,219,075 B1
(45) Date of Patent: Dec. 22, 2015

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/472,504

(22) Filed: Aug. 29, 2014

(51) Int. Cl.
*H01L 21/332* (2006.01)
*H01L 27/115* (2006.01)
*H01L 21/28* (2006.01)
*H01L 21/768* (2006.01)
*H01L 23/528* (2006.01)

(52) U.S. Cl.
CPC .... *H01L 27/11582* (2013.01); *H01L 21/28282* (2013.01); *H01L 21/76802* (2013.01); *H01L 21/76877* (2013.01); *H01L 23/528* (2013.01)

(58) Field of Classification Search
CPC .................................................. H01L 21/8221
See application file for complete search history.

(56) References Cited

U.S. PATENT DOCUMENTS

2010/0120214 A1* 5/2010 Park et al. ..................... 438/287

OTHER PUBLICATIONS

Fukuzumi, et al.: "Optimal Integration and Characteristics of Vertical Array Devices for Ultra-High Density, Bit-Cost Scalable Flash Memory"; 1-4244-0439-X/07/$25.00 © 2007 IEEE; pp. 449-452.

* cited by examiner

*Primary Examiner* — Daniel Whalen
(74) *Attorney, Agent, or Firm* — McClure, Qualey & Rodack, LLP

(57) ABSTRACT

A semiconductor structure and a method for manufacturing the same are provided. The method comprises the following steps. First, a stack of alternate sacrificial layers and insulating layers is formed on a bottom layer on a substrate. Then, a plurality of first holes and a plurality of second holes are formed through the stack concurrently. In the semiconductor structure as formed by the embodied method, the first holes and the second holes are equally spaced apart from each other at least in an arranged direction.

5 Claims, 20 Drawing Sheets

SEMICONDUCTOR STRUCTURE AND METHOD FOR MANUFACTURING THE SAME

BACKGROUND

1. Technical Field

The disclosure relates to a semiconductor structure and a method for manufacturing the same. More particularly, the disclosure relates to a semiconductor structure, in which a plurality of first holes and a plurality of second holes are equally spaced apart from each other in at least an arranged direction, and a method for manufacturing the same.

2. Description of the Related Art

As the layers stacked in 3-D semiconductor structures increase, the height of line structures in the 3-D semiconductor structures increases and thereby may face the collapse or bending problems. Compared to the line structure, hole structure is more robust. As such, the hole structure is introduced into the 3-D semiconductor structures. For example, in a 3-D vertical channel memory device, holes may be constructed for the formation of bit lines (BLs).

In a 3-D vertical channel memory device, the layers of word lines (WLs) are preferably formed by metal due to a lower resistance. As such, a replacing step from polysilicon to the metal must be carried out. This replacing step is typically conducted through holes.

However, the holes for WLs replacement and the holes for BLs are not self-aligned. Thus, a process window for the alignment is needed, and the overall cell size is increased. Nevertheless, an inaccuracy still presents between the two kinds of holes.

SUMMARY

In this disclosure, a semiconductor structure, in which a plurality of first holes and a plurality of second holes are equally spaced apart from each other in at least an arranged direction, and a method for manufacturing the same are provided.

According to some embodiment, the method for manufacturing the semiconductor structure comprises the following steps. First, a stack of alternate sacrificial layers and insulating layers is formed on a bottom layer on a substrate. Then, a plurality of first holes and a plurality of second holes are formed through the stack concurrently.

According to some embodiment, the semiconductor structure comprises a bottom layer formed on a substrate, a stack of alternate conductive layers and insulating layers formed on the bottom layer, and a plurality of first holes and a plurality of second holes through the stack. The first holes and the second holes are equally spaced apart from each other in at least an arranged direction.

Figure 1A:
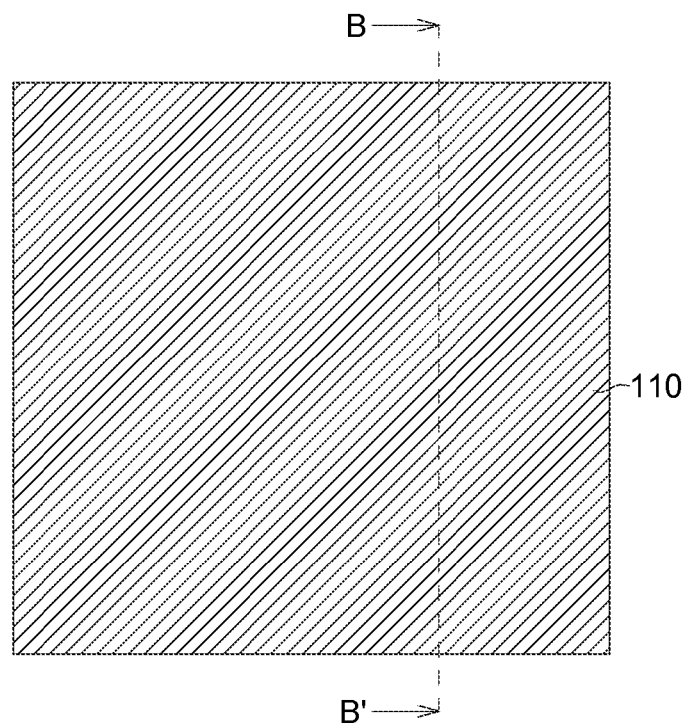
FIG. 1A-FIG. 11B schematically illustrate a method for manufacturing a semiconductor structure according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to said semiconductor structure and the method for manufacturing the same. For purposes of explanation, the following embodiments will be exemplarily focused on a 3-D vertical channel memory device, such as a 3-D vertical channel NAND memory device. However, this invention is not limited thereto, for example, the method may be applied in other semiconductor structures.

FIG. 1A-FIG. 11B schematically illustrate a method for manufacturing a semiconductor structure according to one embodiment of the present disclosure. In this embodiment, while not limited, the holes for BLs (hereinafter first holes) and the holes for WLs replacement (hereinafter second holes) are formed to have the same shapes and the sizes. In this embodiment, the memory layers are configured in the straight-line type. For clarity, the elements may not be shown as their real relative sizes, and some reference numerals may be removed from some figures.

Figure 1B:
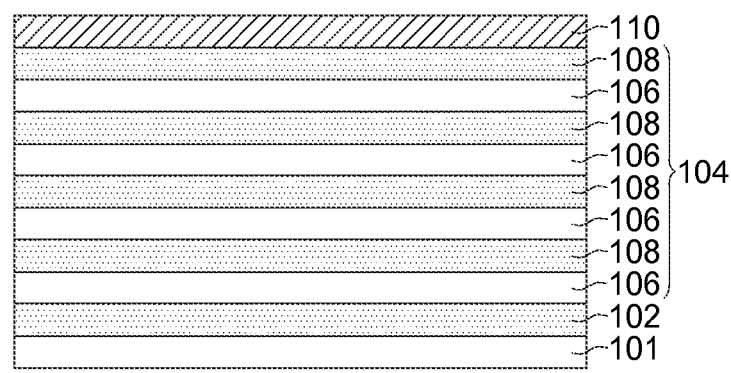

Referring to FIGS. 1A and 1B, a top view and a cross-sectional view taken from B-B' cross-section line are shown, respectively. A substrate 101 may be provided with layers and/or devices optionally formed thereon. A bottom layer 102 may be formed on the substrate 101. The bottom layer 102 may be formed of oxides, and used as an etch stop layer in the following steps. A stack 104 of alternate sacrificial layers 106 and insulating layers 108 is formed on the bottom layer 102. The sacrificial layers 106 may be formed of SiN or polysilicon, and particularly may be formed of SiN. The insulating layers 108 may be formed of oxides. A cap layer 110 is formed on the stack 104. In the case that the sacrificial layers 106 are formed of SiN, the cap layer 110 may be formed of polysilicon. While In the case that the sacrificial layers 106 are formed of polysilicon, the cap layer 110 may be formed of SiN.

Figure 2A:
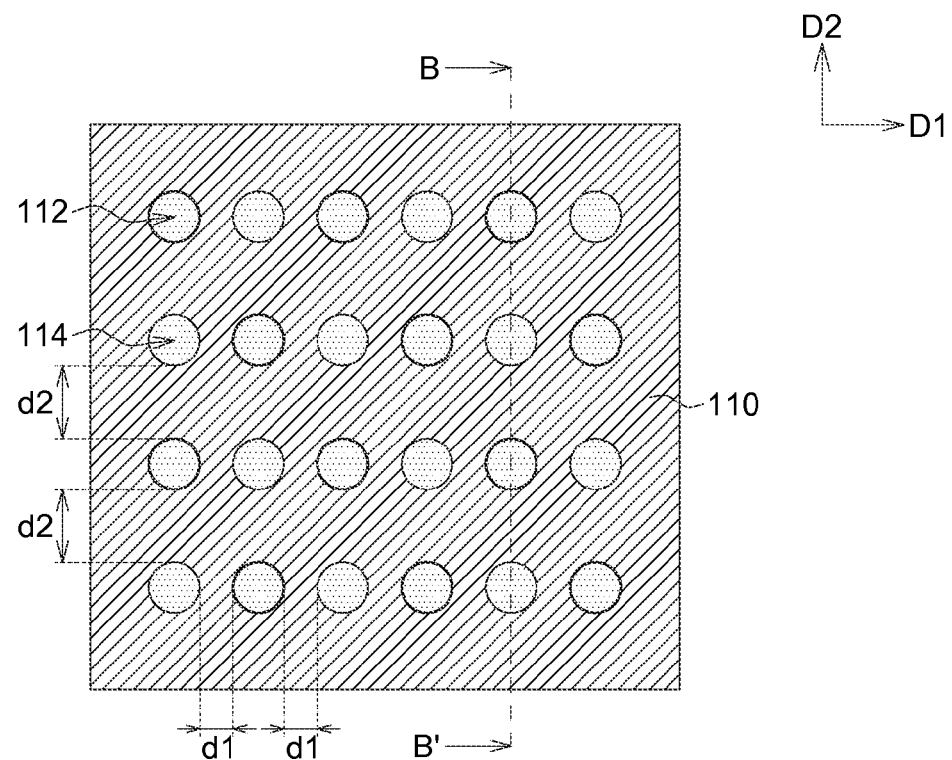
Figure 2B:
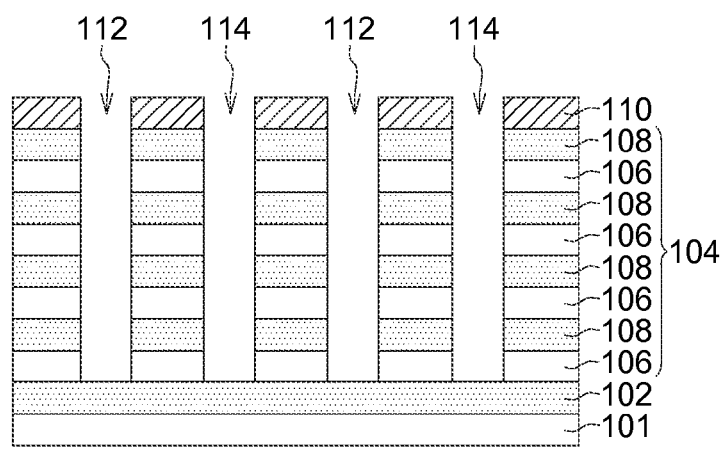

Referring to FIGS. 2A and 2B, a plurality of first holes 112 and a plurality of second holes 114 are formed through the cap layer 110 and the stack 104 concurrently. In this embodiment, the first holes 112 and the second holes 114 are arranged alternately in a matrix. However, the first holes 112 and the second holes 114 may be arranged in other ways as needed. Here, the first holes 112 and the second holes 114 are illustrated to have the same circular cross sections and the same sizes. However, in an alternative embodiment, the shapes and/or the sizes of the first holes 112 and the second holes 114 may be different.

Since the first holes 112 and the second holes 114 are formed at the same time, they can be exactly aligned with each other. More specifically, at least in an arranged direction D1 or D2, the first holes 112 and the second holes 114 are equally spaced apart from each other. For example, in the arranged direction D1, all of the first holes 112 and the second holes 114 are equally spaced apart from each other by a space d1, and in the arranged direction D2, all of the first holes 112 and the second holes 114 are equally spaced apart from each other by a space d2. The value of d1 may or may not equal to the value of d2.

Figure 3A:
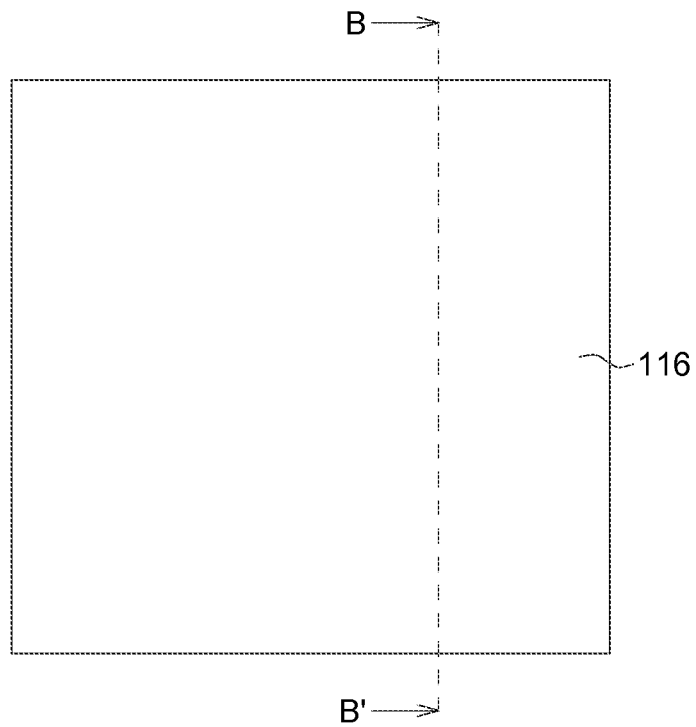
Figure 3B:
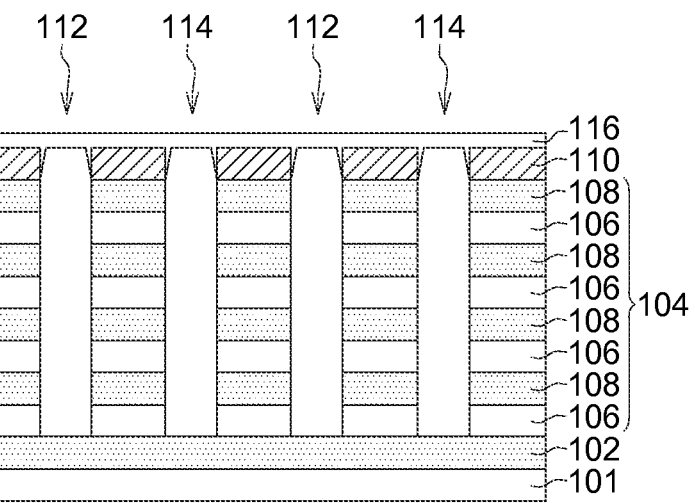

Referring to FIGS. 3A and 3B, a non-conformal layer 116 is formed on the cap layer 110 and covering the first holes 112 and the second holes 114. As such, the first holes 112 and the second holes 114 are closed. Typically, a layer manufactured by physical vapor deposition (PVD) process has the non-conformal characteristic. In one example, the non-conformal layer 116 may be a SiOx layer manufactured by PVD process.

Figure 4A:
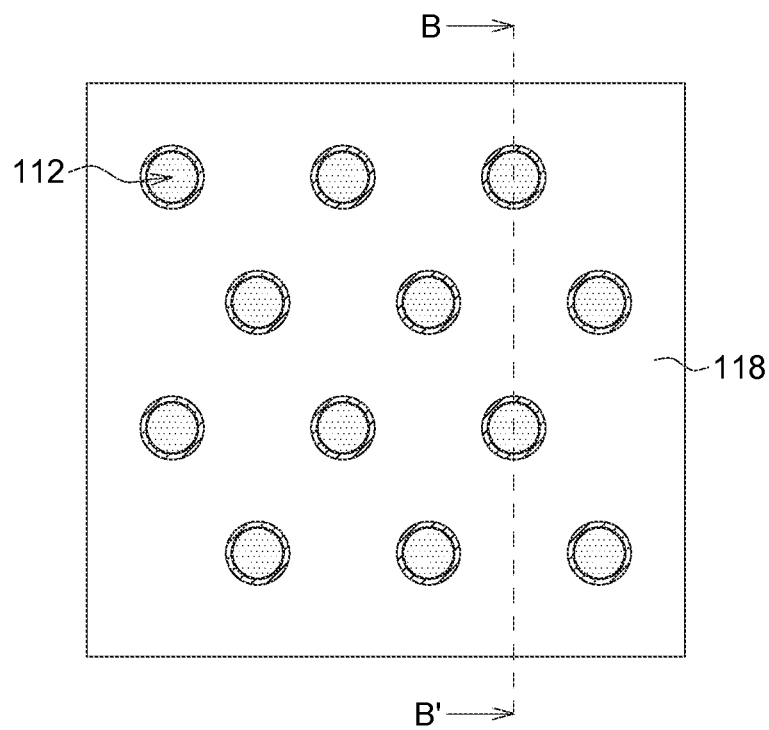
Figure 4B:
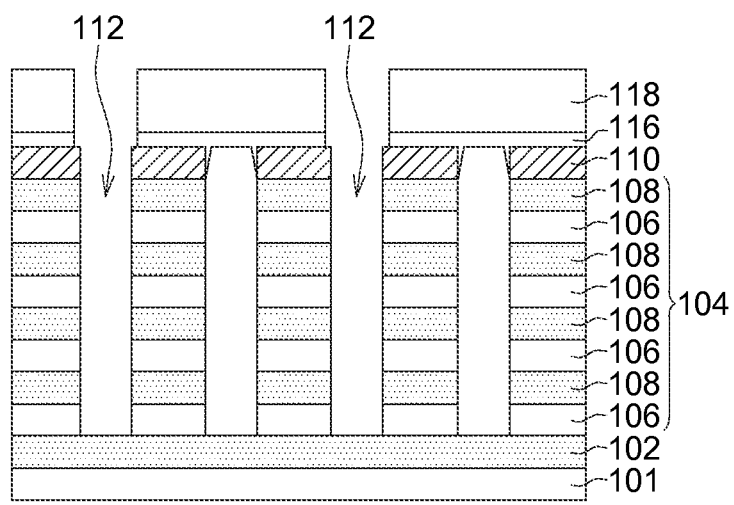
Figure 5A:
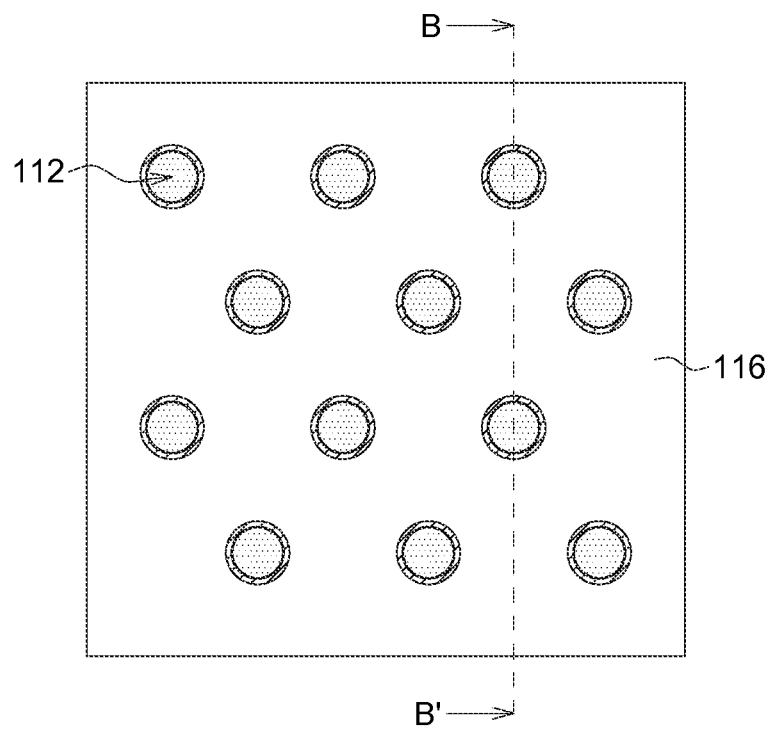
Figure 5B:
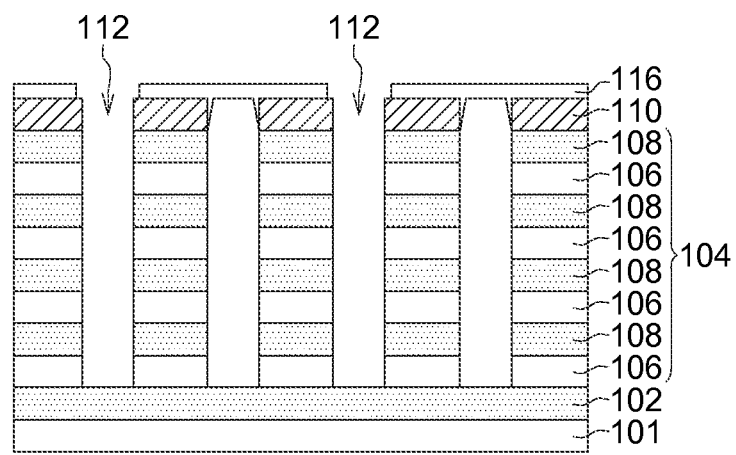

Referring to FIGS. 4A and 4B, a photo resist 118 is formed on the non-conformal layer 116 and used to etch the non-conformal layer 116, so as to open the first holes 112. The etching process may be conducted by dry etching process. In one example, dilute HF is applied to remove some portions of the thinner non-conformal layer 116. The etching process is stopped on the top cap layer 110, and thereby over-etching is prevented. Then, the photo resist 118 is removed, as shown in FIGS. 5A and 5B.

Figure 6A:
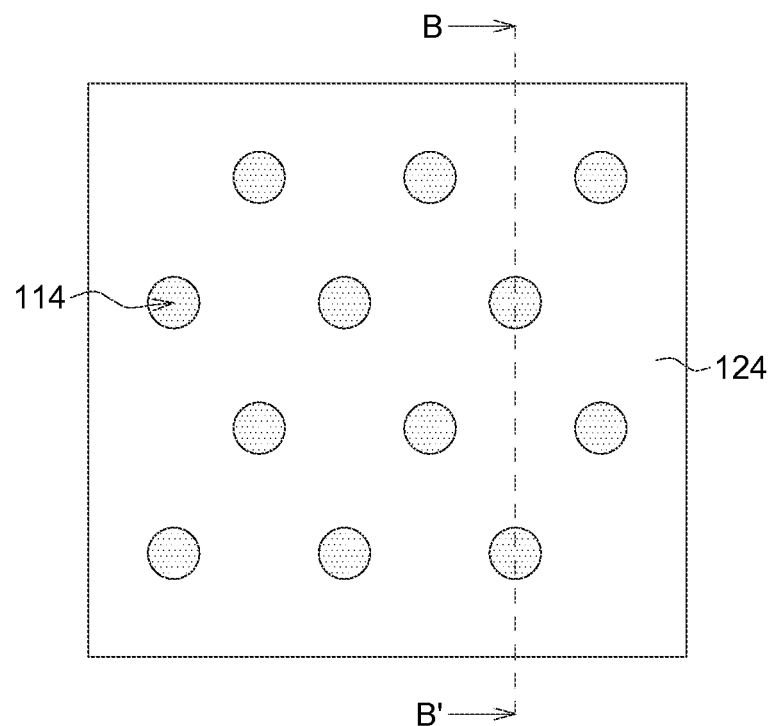
Figure 6B:
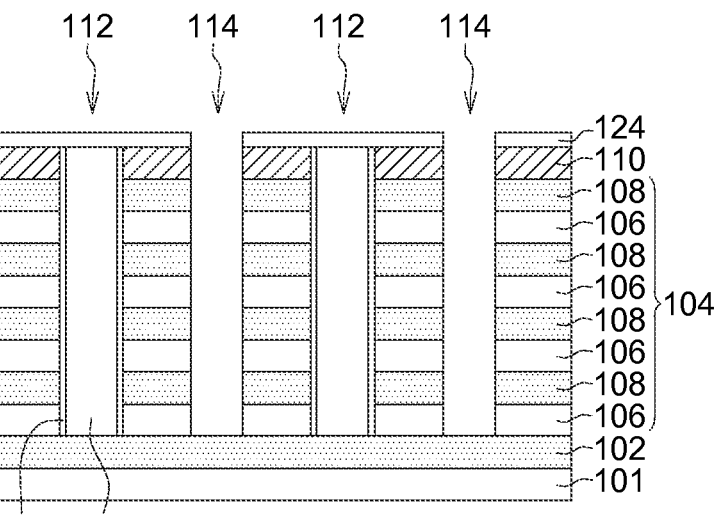

Referring to FIGS. 6A and 6B, in the condition that the second holes 114 are closed by the non-conformal layer 116, memory layers 120 are formed on sidewalls of the first holes 112. The memory layers 120 may have an oxide-nitride-oxide (ONO) structure or an oxide-nitride-oxide-nitride-oxide (ONONO) structure. Then, a conductor 122 is filled into the first holes 112. The conductor 122 may be polysilicon or other suitable channel material. The conductor 122 might form a polysilicon structure or a "macaroni" structure (i.e., a thin polysilicon layer formed on the sidewall of a first hole 112 like a tube with the hollow portion filled by a dielectric, not shown herein).

After that, a chemical mechanical polishing (CMP) process may be optionally carried out. The CMP process is conducted to remove the superfluous material for forming the memory layers 120 and the conductor 122, and is stopped on the non-conformal layer 116.

A temporary protective layer 124 is formed on the cap layer 110 and the memory layers 120 and the conductor 122 in the first holes 112 to protect the memory layers 120 and the conductor 122. The temporary protective layer 124 may be formed of the same material as the non-conformal layer 116. As such, the remaining part of the non-conformal layer 116 is integrated into the temporary protective layer 124. Then, the second holes 114 are opened by a photolithography process and an etching process, as in the opening of the first holes 112.

Figure 7A:
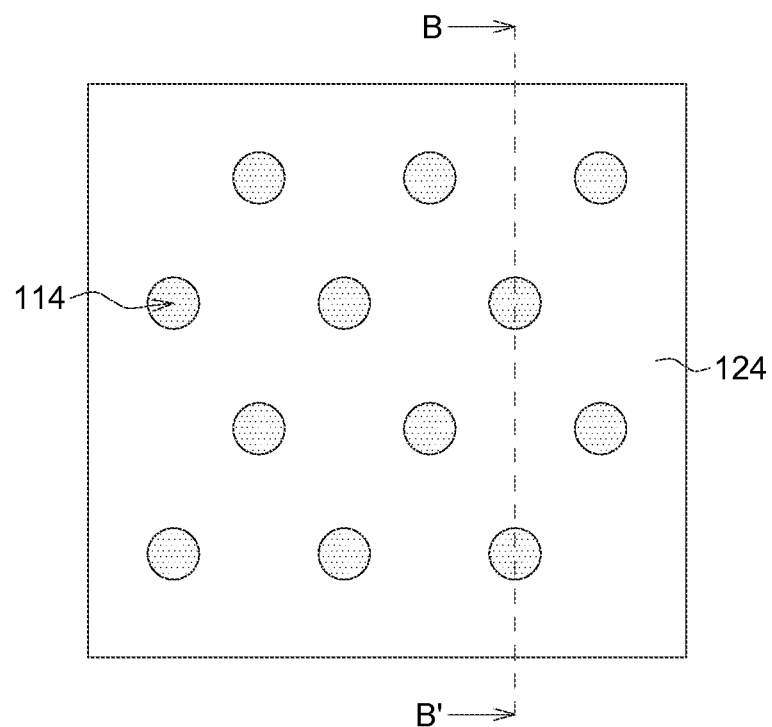
Figure 7B:
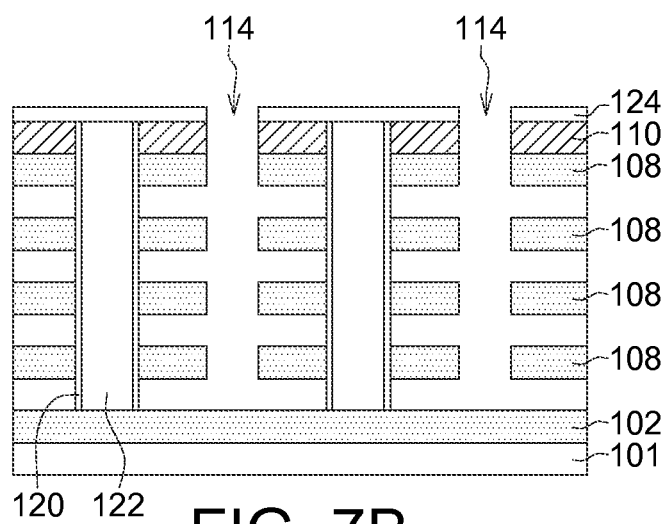

Referring to FIGS. 7A and 7B, the sacrificial layers 106 are removed through the second holes 114. The sacrificial layers 106 may be removed using a high selective etchant. In the case that the sacrificial layers 106 are formed of SiN, the sacrificial layers 106 may be removed using hot $H_3PO_4$. In the case that the sacrificial layers 106 are formed of polysilicon, the sacrificial layers 106 may be removed using a TMAH (tetramethylammonium hydroxide) solution.

Figure 8A:
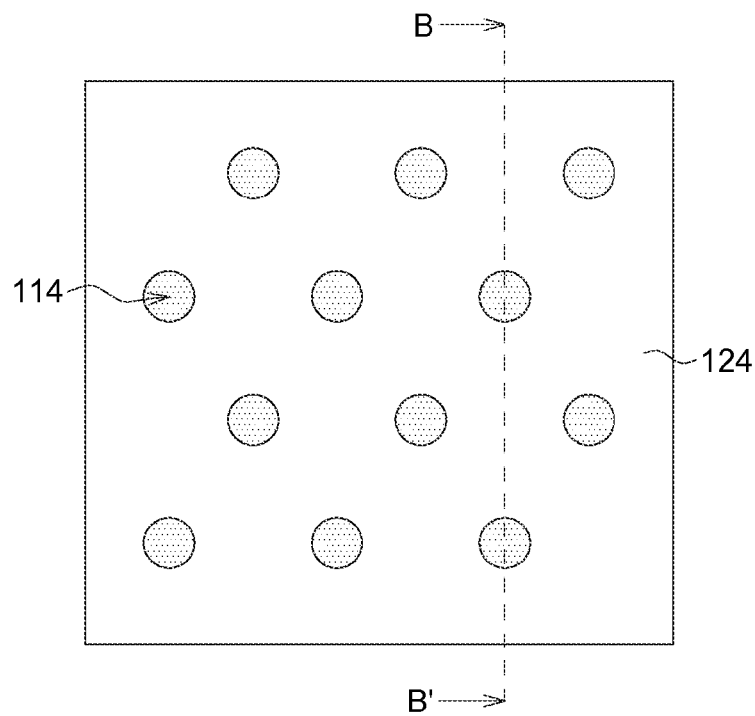
Figure 8B:
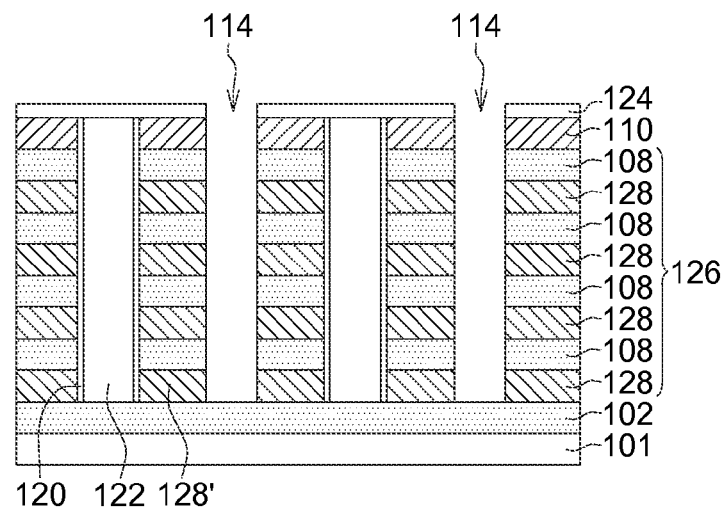

Referring to FIGS. 8A and 8B, a conductive material 128' is filled through the second holes 114. The parts of the conductive material 128' that are positioned in the second holes 114 is then removed such as by isotropic etching process. As such, a stack 126 constituted by conductive layers 128 and the insulating layers 108 are formed. The conductive material 128' may be W/TiN, TiN, Cu/TaN or the like. In one example, the conductive layers 128 are formed of chemical vapor deposited W and deposited TiN. Before the filling of the conductive material 128', a high-k material may be optionally deposited.

Figure 9A:
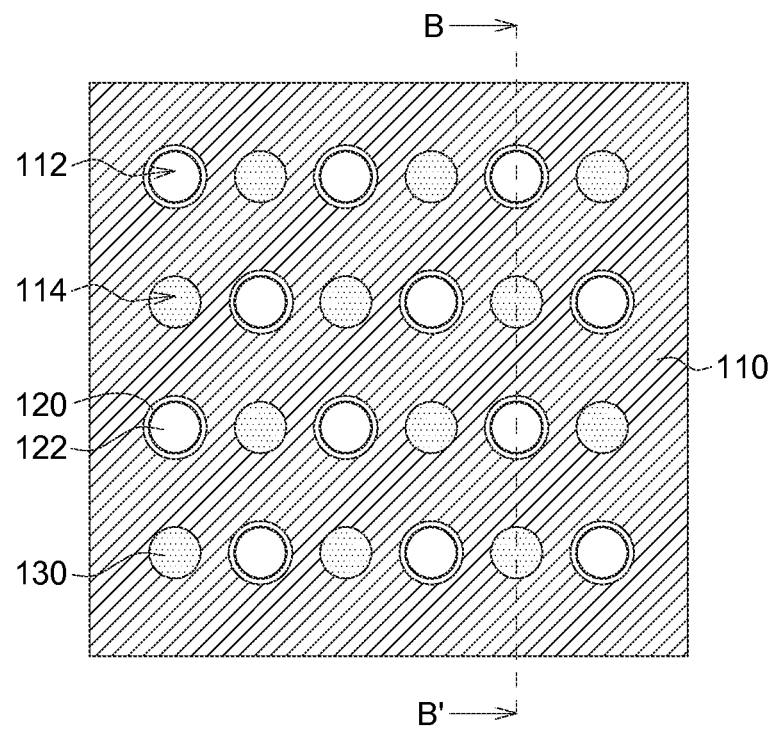
Figure 9B:
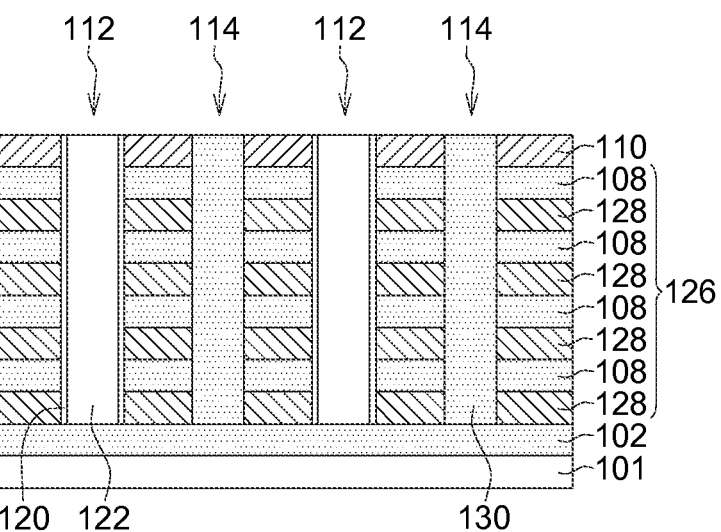
Figure 10A:
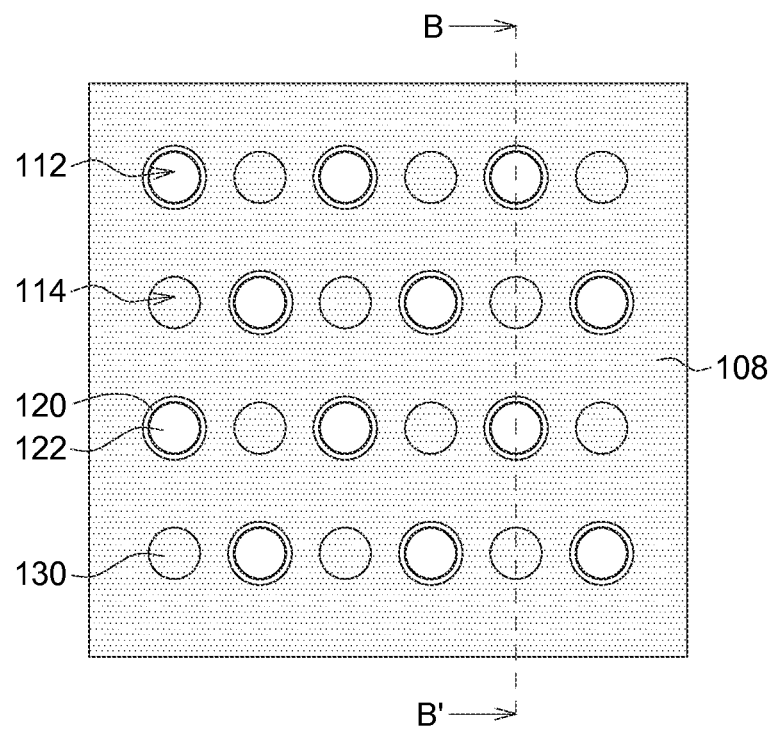
Figure 10B:
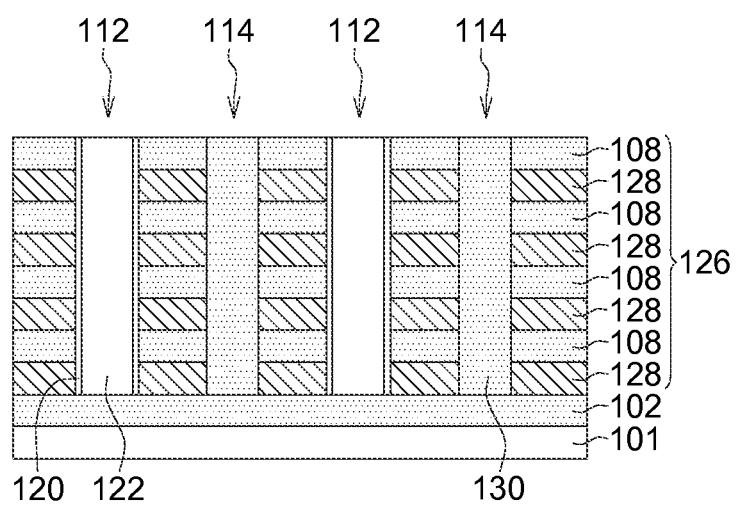

Referring to FIGS. 9A and 9B, an insulator 130 is filled into the second holes 114. The insulator 130 may be an oxide. After that, temporary protective layer 124 is removed. In one example, a CMP process may be carried out. The CMP process is conducted to remove the superfluous material for forming the insulator 130 (if exists) and the temporary protective layer 124, and is stopped on the cap layer 110. Then, as shown in FIGS. 10A and 10B, the cap layer 110 is removed. As such, the stack 126 is exposed.

Figure 11A:
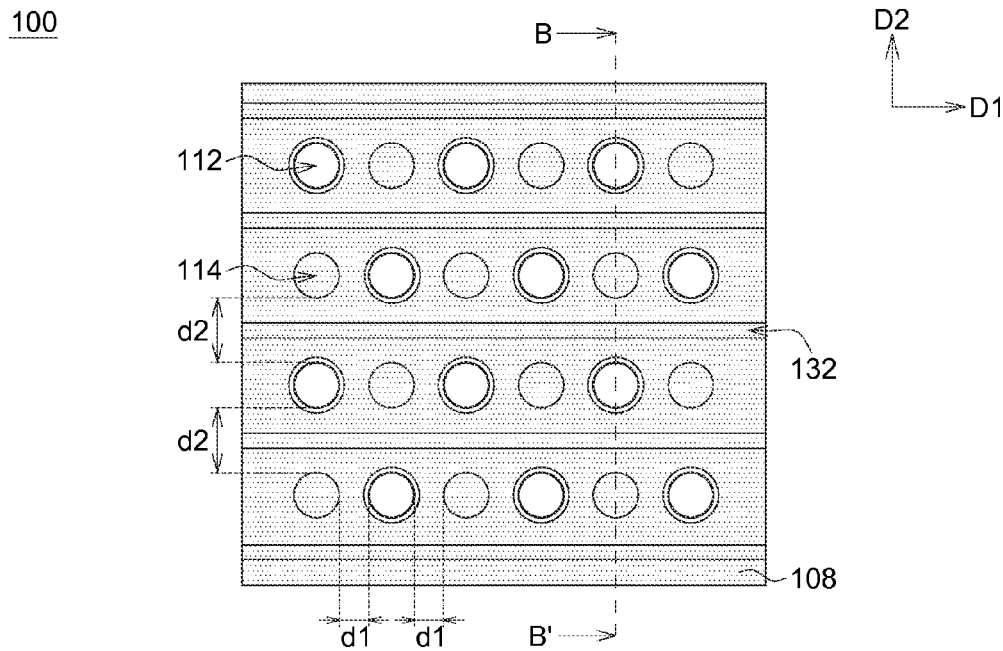
Figure 11B:
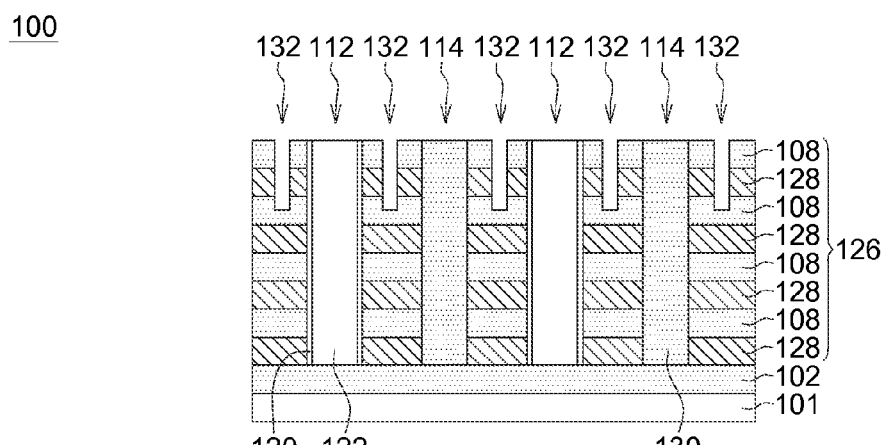

Referring to FIGS. 11A and 11B, in this embodiment, the uppermost conductive layer 128 and insulating layer 108 may be cut, and cut lines 132 are shown in FIGS. 11A and 11B. In a 3-D vertical channel memory device, the cut uppermost conductive layer 128 may be used as string select lines, and the other conductive layers 128 may be used as word lines and ground select line(s).

The formed semiconductor structure 100 comprises a bottom layer 102 and a stack 126 of alternate conductive layers 128 and insulating layers 108 formed on the bottom layer 102. The semiconductor structure 100 further comprises a plurality of first holes 112 and a plurality of second holes 114 through the stack 126. Since the first holes 112 and the second holes 114 are formed at the same time, they can be exactly aligned with each other. At least in an arranged direction D1 or D2, the first holes 112 and the second holes 114 are equally spaced apart from each other. In this embodiment, the first holes 112 and the second holes 114 are equally spaced apart from each other in two orthogonal directions D1 and D2. In the arranged direction D1, all of the first holes 112 and the second holes 114 are equally spaced apart from each other by a space d1, and in the arranged direction D2, all of the first holes 112 and the second holes 114 are equally spaced apart from each other by a space d2. The value of d1 may or may not equal to the value of d2. The semiconductor structure 100 may further comprise memory layers 120 formed on the sidewalls of the first holes 112, a conductor 122 filled into the first holes 112, and an insulator 130 filled into the second holes 114.

FIG. 12A-FIG. 20B schematically illustrate a method for manufacturing a semiconductor structure according to another embodiment of the present disclosure. In this embodiment, while not limited, the first holes and the second holes are formed to have different shapes and sizes. In this embodiment, the memory layers are configured in the biconcave type. For clarity, the elements may not be shown as their real relative sizes, and some reference numerals may be removed from some figures.

Figure 12A:
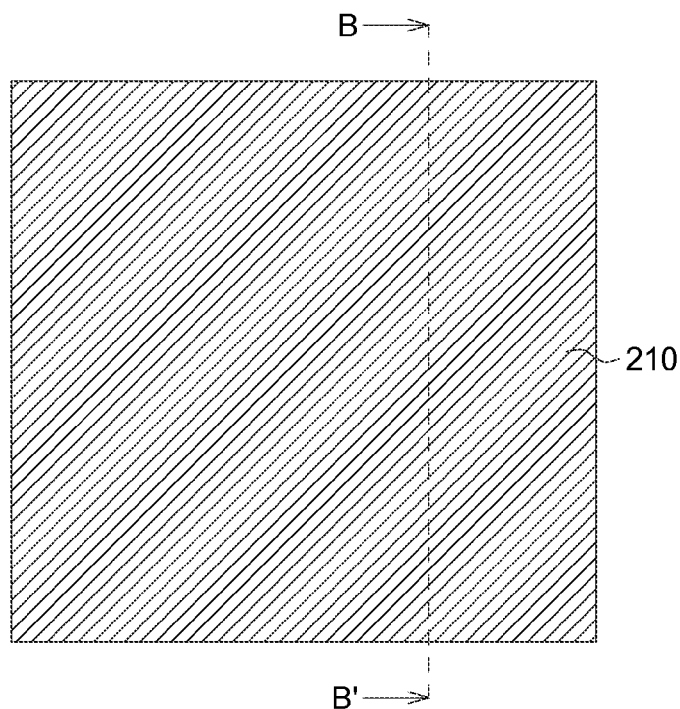
FIG. 12A-FIG. 20B schematically illustrate a method for manufacturing a semiconductor structure according to another embodiment of the present disclosure.
Figure 12B:
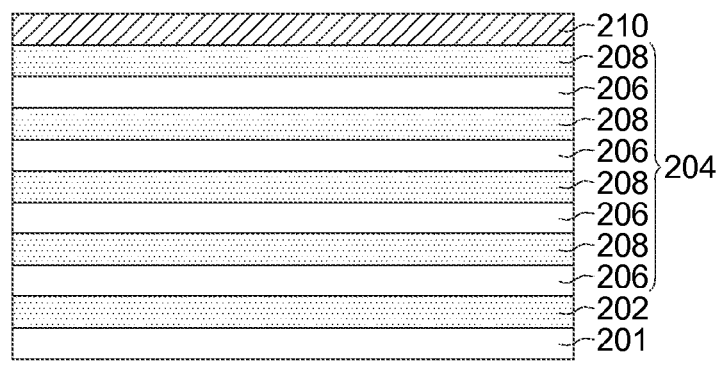

Referring to FIGS. 12A and 12B, a substrate 201 may be provided with layers and/or devices optionally formed thereon. A bottom layer 202 may be formed on the substrate 201. The bottom layer 202 may be formed of oxides, and used as an etch stop layer in the following steps. Then, a stack 204 of alternate sacrificial layers 206 and insulating layers 208 is formed on the bottom layer 202. The sacrificial layers 206 may be formed of SiN or polysilicon, and particularly may be formed of SiN. The insulating layers 208 may be formed of oxides. A cap layer 210 is formed on the stack 204. In the case that the sacrificial layers 206 are formed of SiN, the cap layer 210 may be formed of polysilicon. While In the case that the sacrificial layers 206 are formed of polysilicon, the cap layer 210 may be formed of SiN.

Figure 13A:
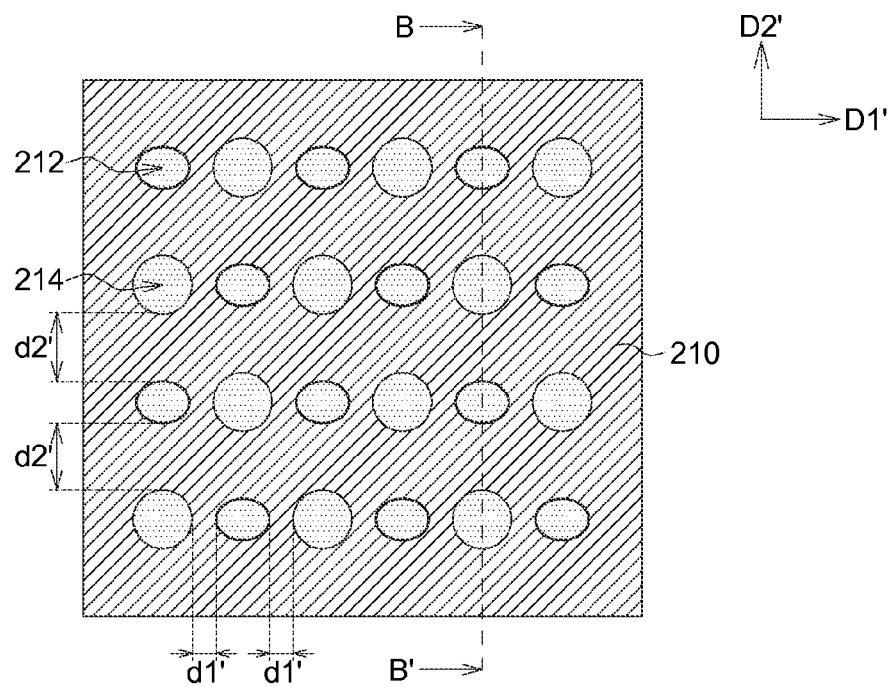
Figure 13B:
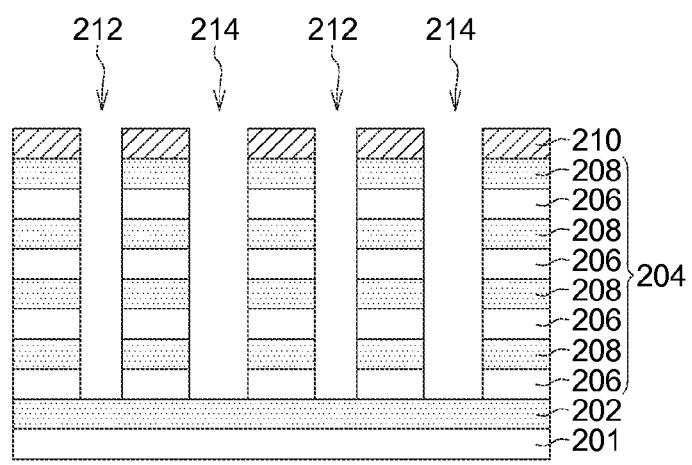

Referring to FIGS. 13A and 13B, a plurality of first holes 212 and a plurality of second holes 214 are formed through the cap layer 210 and the stack 204 concurrently. In this embodiment, the first holes 212 and the second holes 214 are arranged alternately in a matrix. However, the first holes 212 and the second holes 214 may be arranged in other ways as needed. Here, the first holes 212 and the second holes 214 are illustrated to have different cross sections (i.e., elliptical and circular) and different sizes. However, in an alternative embodiment, the shapes and/or the sizes of the first holes 212 and the second holes 214 may be the same, as in the embodiment illustrated in FIGS. 1A-11B.

Since the first holes 212 and the second holes 214 are formed at the same time, they can be exactly aligned with each other. More specifically, at least in an arranged direction D1' or D2', the first holes 212 and the second holes 214 are equally spaced apart from each other. For example, in the arranged direction D1', all of the first holes 212 and the second holes 214 are equally spaced apart from each other by a space d1', and in the arranged direction D2', all of the first holes 212 and the second holes 214 are equally spaced apart from each other by a space d2'. The value of d1' may or may not equal to the value of d2'.

Figure 14A:
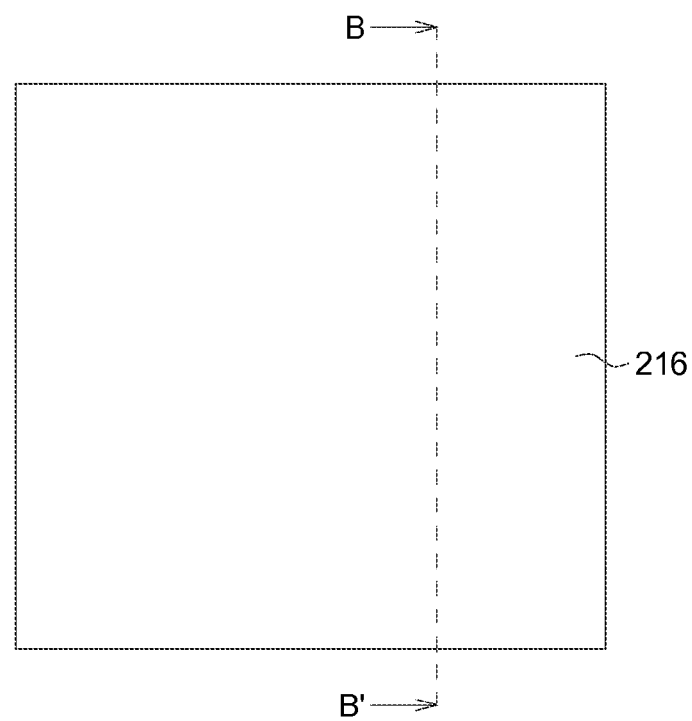
Figure 14B:
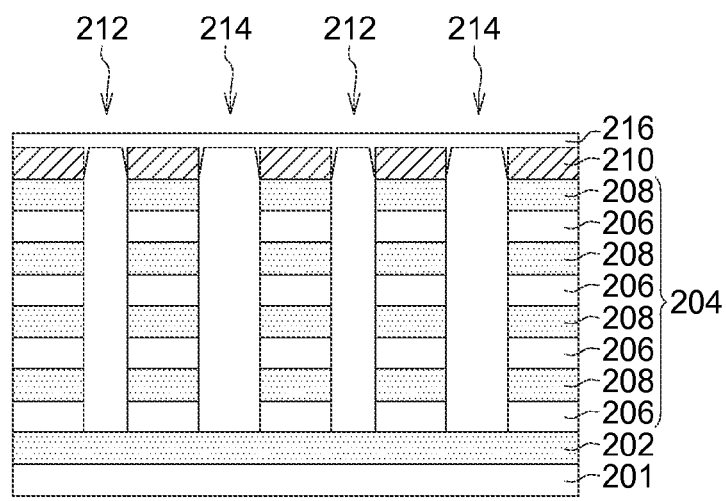

Referring to FIGS. 14A and 14B, a non-conformal layer 216 is formed on the cap layer 210 and covering the first hole 212 and the second holes 214. As such, the first holes 212 and the second holes 214 are closed. Typically, a layer manufactured by PVD process has the non-conformal characteristic. In one example, the non-conformal layer 216 may be a SiOx layer manufactured by PVD process.

Figure 15A:
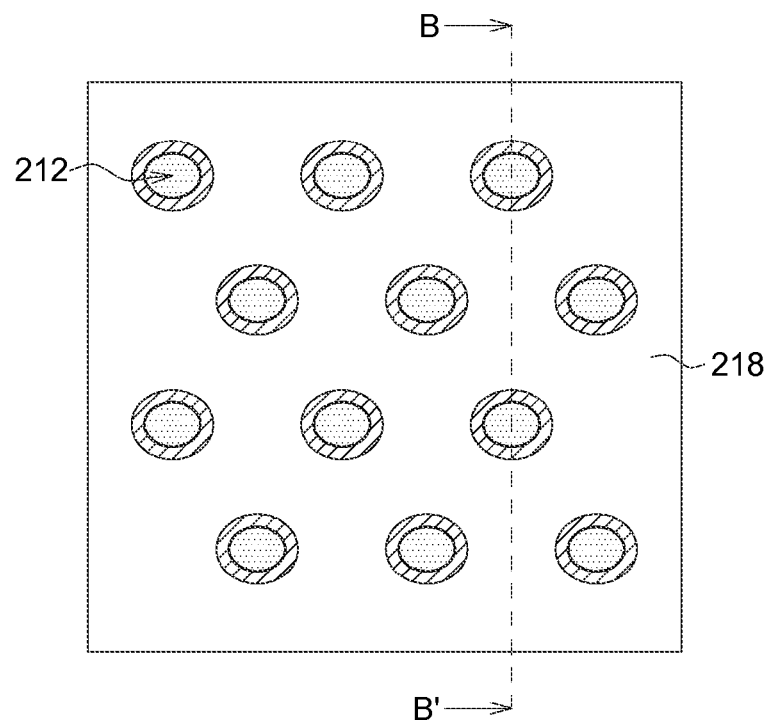
Figure 15B:
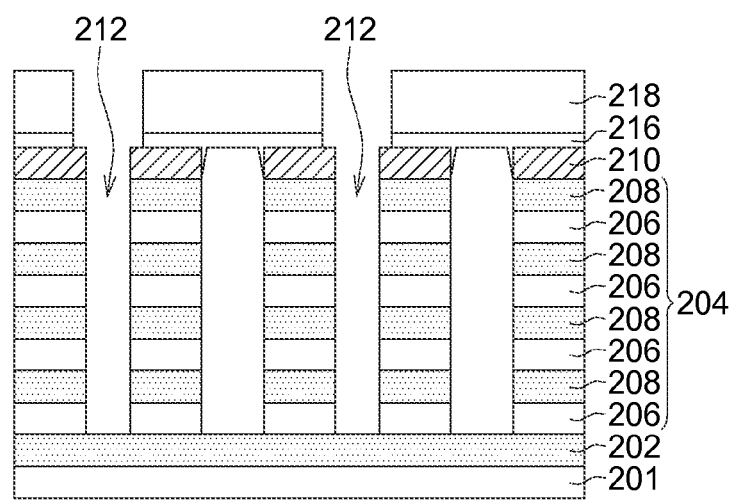
Figure 16A:
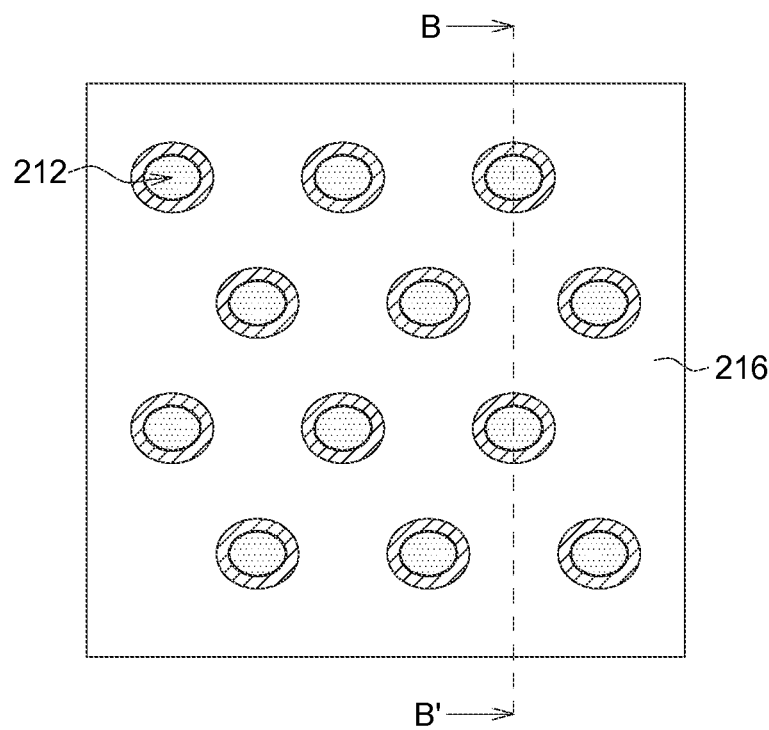
Figure 16B:
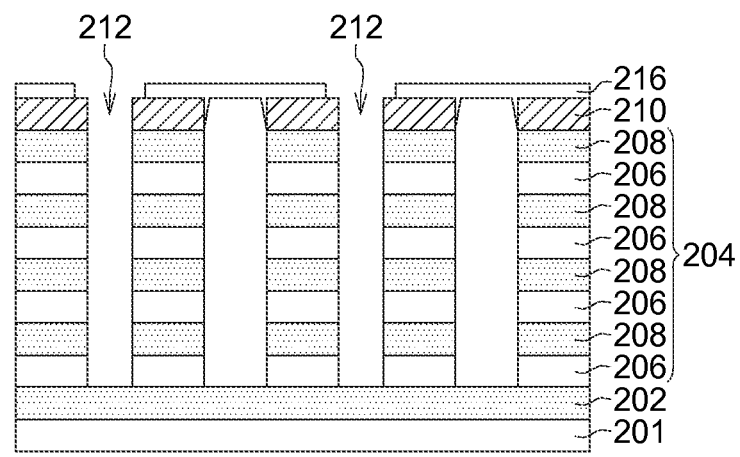

Referring to FIGS. 15A and 15B, a photo resist 218 is formed on the non-conformal layer 216 and used to etch the non-conformal layer 216, so as to open the first holes 212. The etching process may be conducted by dry etch process. In one example, dilute HF is applied to remove some thinner non-conformal layer 216. The etching process is stopped on the top cap layer 210, and thereby over-etching is prevented. Then, the photo resist 218 is removed, as shown in FIGS. 16A and 16B.

Figure 17A:
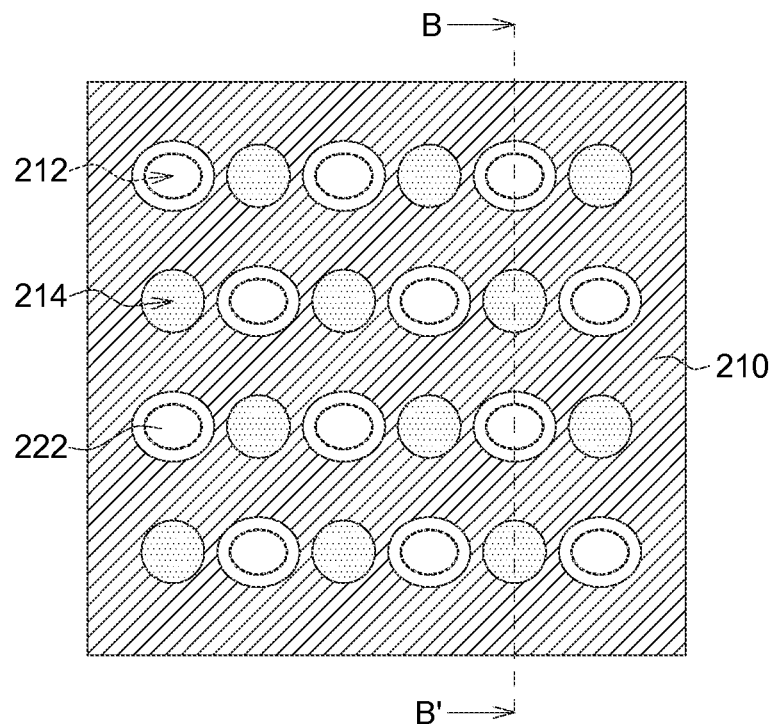
Figure 17B:
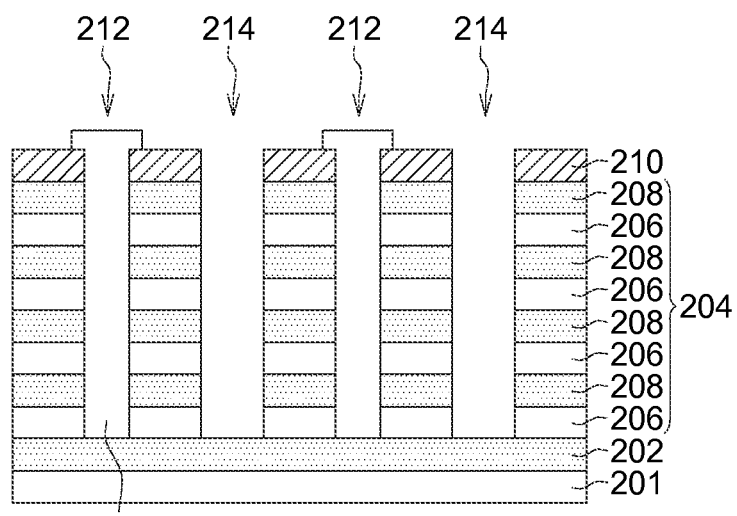

Referring to FIGS. 17A and 17B, in the condition that the second holes 214 are closed by the non-conformal layer 216, a conductor 222 is filled into the first holes 212. The conductor 222 may be polysilicon or other suitable channel material. The conductor 222 might form a polysilicon structure or a macaroni channel structure (not shown). After that, a CMP process may be optionally carried out. The CMP process is conducted to remove the superfluous material for forming the conductor 222, and is stopped on the non-conformal layer 216. Then, the remainder of the non-conformal layer 216 is removed such as by etching process. As such, the second holes 214 are opened.

Figure 18A:
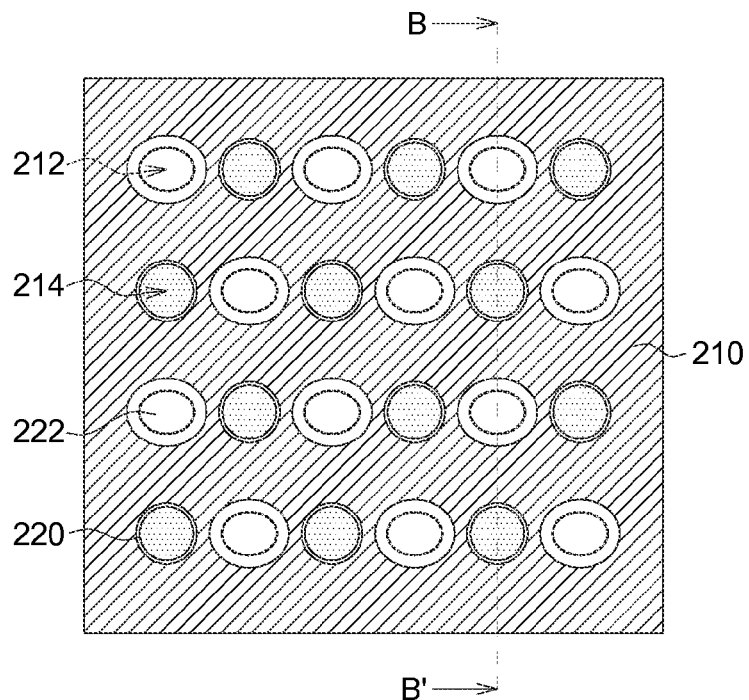
Figure 18B:
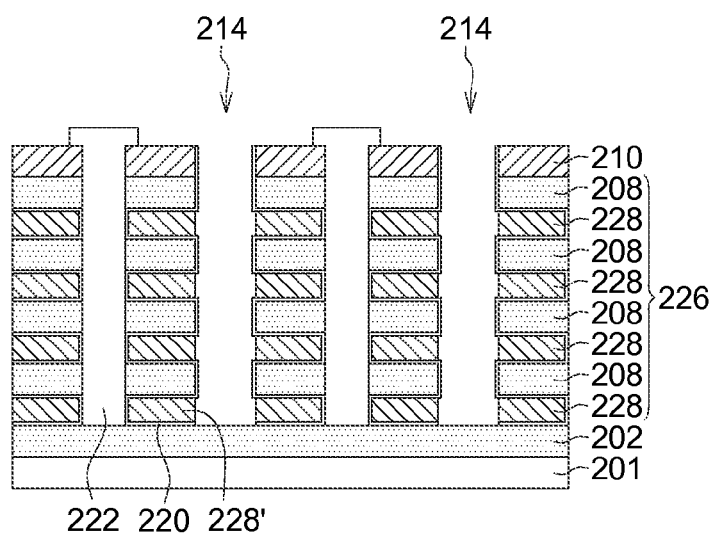

Referring to FIGS. 18A and 18B, the sacrificial layers 206 are removed through the second holes 214. The sacrificial layers 206 may be removed using a high selective etchant. In the case that the sacrificial layers 206 are formed of SiN, the sacrificial layers 206 may be removed using hot $H_3PO_4$. In the case that the sacrificial layers 206 are formed of polysilicon, the sacrificial layers 206 may be removed using a TMAH solution.

Memory layers 220 are formed on top surfaces and bottom surfaces of the insulating layers 208 exposed by the removal of the sacrificial layers 206 and side surfaces of the insulating layers 208 exposed in the second holes 214. The memory layers 220 may have an ONO structure or an ONONO structure.

Then, a conductive material 228' is filled through the second holes 214. The parts of the conductive material 228' that are positioned in the second holes 214 is then removed such as by isotropic etching process. As such, a stack 226 constituted by conductive layers 228 and the insulating layers 208 are formed. The conductive material 228' may be W/TiN, TiN, Cu/TaN or the like. In one example, the conductive layers 228 are formed of chemical vapor deposited W and deposited TiN. Before the filling of the conductive material 228', a high-k material may be optionally deposited.

Figure 19A:
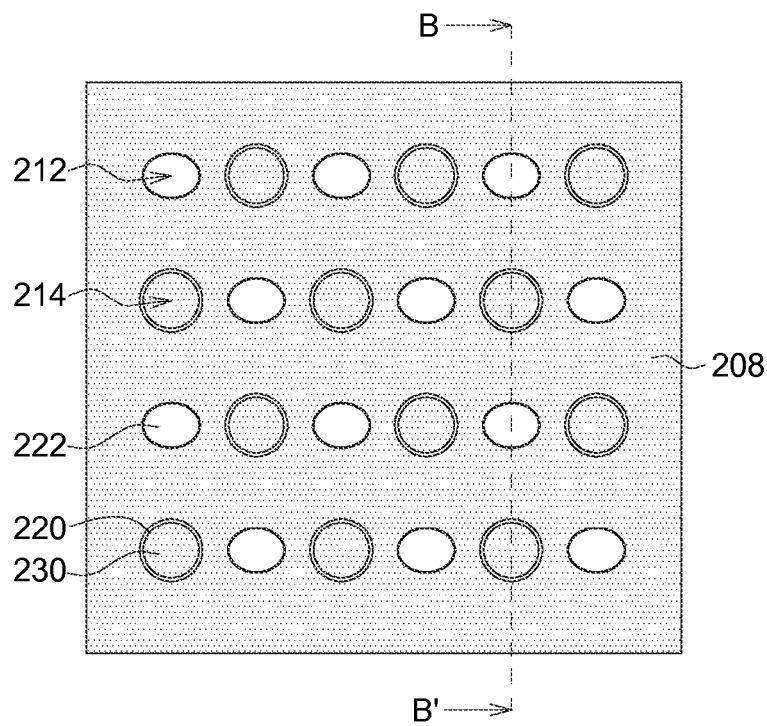
Figure 19B:
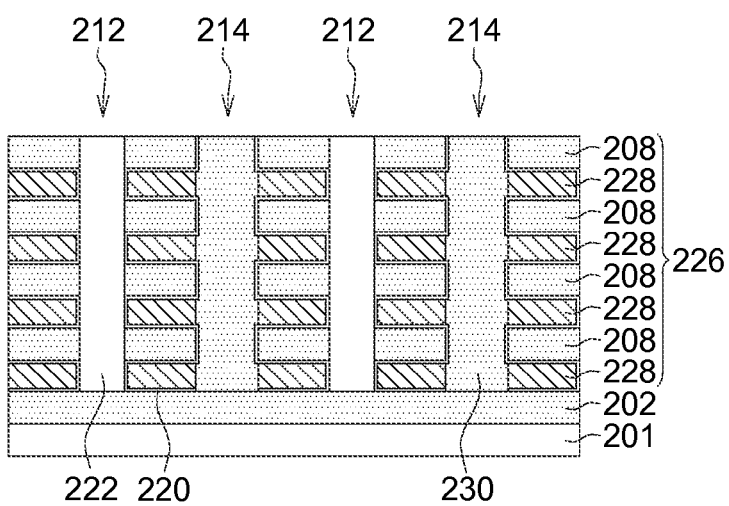

Referring to FIGS. 19A and 19B, an insulator 230 is filled into the second holes 214. The insulator 230 may be an oxide. After that, the cap layer 210 is removed is removed. In one example, a CMP process may be carried out. The CMP process is conducted to remove the superfluous material for forming the insulator 230 (if exists) and the cap layer 210 and is stopped on the uppermost insulating layer 208. As such, the stack 226 is exposed.

Figure 20A:
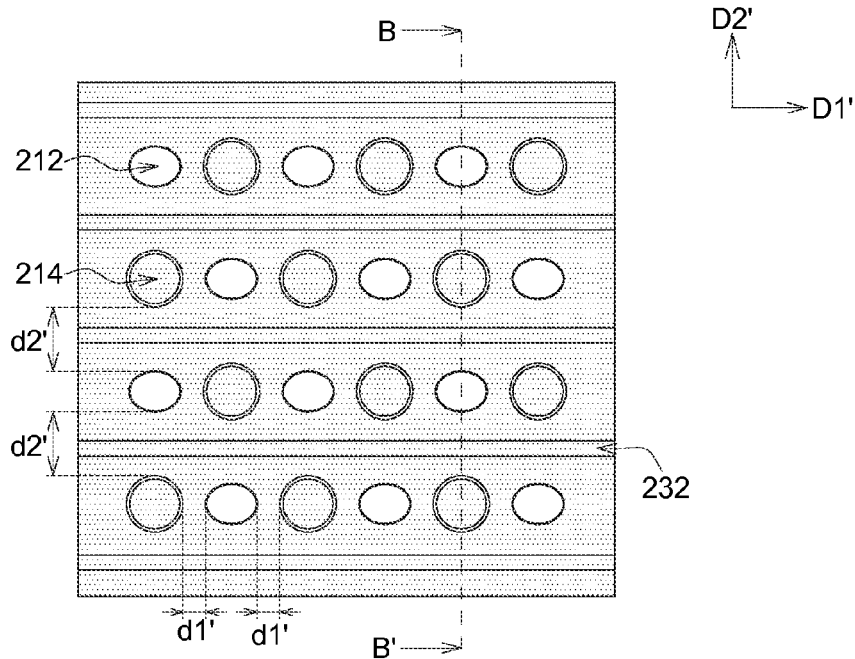
Figure 20B:
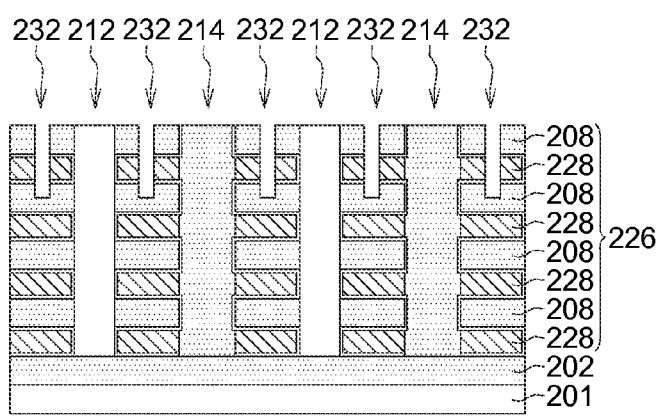

Referring to FIGS. 20A and 20B, in this embodiment, the uppermost conductive layer 228 and insulating layer 208 may be cut, and cut lines 232 are shown in FIGS. 20A and 20B. In a 3-D vertical channel memory device, the cut uppermost conductive layer 228 may be used as string select lines, and the other conductive layers 228 may be used as word lines and ground select line(s).

The formed semiconductor structure 200 comprises a bottom layer 202 and a stack 226 of alternate conductive layers 228 and insulating layers 208 formed on the bottom layer 202. The semiconductor structure 200 further comprises a plurality of first holes 212 and a plurality of second holes 214 through the stack 226. Since the first holes 212 and the second holes 214 are formed at the same time, they can be exactly aligned with each other. At least in an arranged direction D1' or D2', the first holes 212 and the second holes 214 are equally spaced apart from each other. In this embodiment, the first holes 212 and the second holes 214 are equally spaced apart from each other in two orthogonal directions D1' and D2'. In the arranged direction D1', all of the first holes 212 and the second holes 214 are equally spaced apart from each other by a space d1', and in the arranged direction D2', all of the first holes 212 and the second holes 214 are equally spaced apart from each other by a space d2'. The value of d1' may or may not equal to the value of d2'. In this embodiment, the first holes 212 and the second holes 214 have different shapes and sizes.

The semiconductor structure 200 may further comprise memory layers 220 formed on top surfaces, bottom surfaces and side surfaces of the insulating layers 208. The semiconductor structure 200 may further comprise a conductor 222 filled into the first holes 212 and an insulator 230 filled into the second holes 214.

According to this disclosure, two kinds of holes for different purposes are formed at the same time. Thus, the alignment issue is withdrawn from consideration. A process window for the alignment is unneeded and the overall cell size can be decreased. In addition, the step of forming the holes through multi-layers may be carried out only one time, and thereby the manufacturing time and cost can be saved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
    forming a stack of alternate sacrificial layers and insulating layers on a bottom layer on a substrate;
    forming a cap layer on the stack;
    forming a plurality of first holes and a plurality of second holes through the stack and the cap layer concurrently;
    forming a non-conformal layer on the cap layer and covering the first holes and the second holes;
    opening the first holes;
    forming memory layers on sidewalls of the first holes;
    filling a conductor into the first holes;
    forming a temporary protective layer on the cap layer, and the memory layers and the conductor in the first holes; and
    opening the second holes.

2. The method according to claim 1, further comprising:
    removing the sacrificial layers through the second holes; and
    forming a stack constituted by conductive layers and the insulating layers, comprising:
        filling a conductive material through the second holes; and removing the parts of the conductive material that are positioned in the second holes.

3. The method according to claim 2, further comprising:
filling an insulator into the second holes.

4. The method according to claim 3, further comprising:
removing the temporary protective layer and the cap layer.

5. The method according to claim 4, further comprising:
cutting the uppermost conductive layer and insulating layer to form string select lines.

\* \* \* \* \*